United States Patent
Soeta et al.

(10) Patent No.: US 8,236,104 B2
(45) Date of Patent: Aug. 7, 2012

(54) SINGLE-CRYSTAL MANUFACTURING APPARATUS AND SINGLE-CRYSTAL MANUFACTURING METHOD

(75) Inventors: Satoshi Soeta, Echizen (JP); Toshifumi Fujii, Echizen (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 12/991,714

(22) PCT Filed: May 8, 2009

(86) PCT No.: PCT/JP2009/002018
§ 371 (c)(1),
(2), (4) Date: Nov. 9, 2010

(87) PCT Pub. No.: WO2010/001519
PCT Pub. Date: Jan. 7, 2010

(65) Prior Publication Data
US 2011/0056427 A1  Mar. 10, 2011

(30) Foreign Application Priority Data
Jul. 1, 2008 (JP) ................. 2008-172756

(51) Int. Cl.
*C30B 15/20* (2006.01)
(52) U.S. Cl. .......... 117/217; 117/11; 117/13; 117/14; 117/15; 117/17; 117/18; 117/19; 117/20; 117/21; 117/22; 117/30; 117/31; 117/32; 117/33; 117/34; 117/200; 117/206; 117/208; 117/213; 117/214; 117/215; 117/216; 117/218
(58) Field of Classification Search ........... 117/203, 117/11, 13–15, 17–22, 30–34, 200, 206, 117/208, 213–218, 931–932
See application file for complete search history.

(56) References Cited

U.S. PATENT DOCUMENTS

| | | | | |
|---|---|---|---|---|
| 2,537,276 A | * | 1/1951 | McMahon et al. | 62/304 |
| 5,005,557 A | * | 4/1991 | Bachli | 126/572 |

(Continued)

FOREIGN PATENT DOCUMENTS

JP       A 64-065086       3/1989

(Continued)

OTHER PUBLICATIONS

International Search Report issued in corresponding International Application No. PCT/JP2009/002018, mailed Jul. 21, 2009. (with English-language translation).

*Primary Examiner* — Michael Kornakov
*Assistant Examiner* — Kenneth A Bratland, Jr.
(74) *Attorney, Agent, or Firm* — Oliff & Berridge, PLC

(57) ABSTRACT

A single-crystal manufacturing apparatus comprising at least: a main chamber configured to accommodate a crucible; a pulling chamber continuously provided above the main chamber, the pulling chamber into which a grown single crystal is pulled and accommodated; a gas inlet provided in the pulling chamber; a gas flow-guide cylinder downwardly extending from a ceiling of the main chamber; and a heat-insulating ring upwardly extending from a lower end portion of the gas flow-guide cylinder with a diameter of the heat-insulating ring increased so as to surround an outside of the gas flow-guide cylinder, wherein at least one window is provided in a region between 50 and 200 mm from a lower end of the gas flow-guide cylinder, and an opening area of the window accounts for 50% or more of a surface area of the region between 50 and 200 mm from the lower end of the gas flow-guide cylinder.

2 Claims, 3 Drawing Sheets

U.S. PATENT DOCUMENTS

| | | | | |
|---|---|---|---|---|
| 5,720,810 A | * | 2/1998 | Arai et al. | 117/221 |
| 6,146,459 A | * | 11/2000 | Park | 117/217 |
| 7,594,966 B2 | * | 9/2009 | Hoshi et al. | 117/89 |
| 2008/0035050 A1 | | 2/2008 | Sakurada | |

FOREIGN PATENT DOCUMENTS

| | | | |
|---|---|---|---|
| JP | A 3-097688 | | 4/1991 |
| JP | A 5-238874 | | 9/1993 |
| JP | A 7-033587 | | 2/1995 |
| JP | A 8-319190 | | 12/1996 |
| JP | 09508378 | * | 8/1997 |
| JP | A 9-309787 | | 12/1997 |
| JP | A 11-157996 | | 6/1999 |
| JP | B2 3634867 | | 1/2005 |
| WO | WO 2006/040878 A1 | | 4/2006 |
| WO | WO 2009/087724 | * | 7/2009 |

\* cited by examiner

The growth rate shows a relative rate when a growth rate at which OSF disappeared in a conventional method is 1.0.

SINGLE-CRYSTAL MANUFACTURING APPARATUS AND SINGLE-CRYSTAL MANUFACTURING METHOD

TECHNICAL FIELD

The present invention relates to a single-crystal manufacturing apparatus and method based on the Czochralski method (hereinafter, referred to as the CZ method).

BACKGROUND ART

Hereinafter, a conventional single-crystal manufacturing apparatus based on the Czochralski method will be explained by exemplifying growing a silicon single crystal.

FIG. 6 shows a schematic sectional view of an example of the conventional single-crystal manufacturing apparatus.

In the single-crystal manufacturing apparatus 101 used for manufacturing a silicon single crystal based on the CZ method, there are generally arranged crucibles 109 and 110 that contain a raw material melt 106 and are movable upwardly and downwardly, and a heater 111 that is arranged so as to surround the crucibles 109 and 110, inside a main chamber 105 where the single crystal is grown. A pulling chamber 107 for accommodating and taking out the grown single crystal is continuously provided above the main chamber 105. In the case of manufacturing a single crystal by using the single-crystal manufacturing apparatus 101 as described above, a seed crystal 113 is dipped in the raw material melt 106 and gently pulled upwardly with being rotated to grow a rod-shaped single crystal 108, while the crucibles 109 and 110 are moved upwardly according to the growth of the crystal so that a melt surface is always maintained at a constant height in order to obtain a desired diameter and desired crystal quality.

When the single crystal 108 is grown, after the seed crystal 113 attached to a seed holder 114 is dipped in the raw material melt 106, a wire 115 is gently wound up with being rotated in a desired direction with a pulling mechanism (not shown) to grow the single crystal 108 at an end portion of the seed crystal 113.

In this case, a pulling rate for a constant diameter portion having a constant diameter of the single crystal 108 is extremely slow, for example, approximately 0.4 to 2.0 mm/min, depending on the diameter of the single crystal to be pulled. If it is pulled fast by constraint, the single crystal during the growth is deformed, and consequently a cylindrical product having a constant diameter can be no longer obtained. Otherwise, there arise problems such that slip dislocations are generated in the single crystal 108, the single crystal 108 cannot be a product by being detached from the melt and the like. Thus, increasing a crystal growth rate has been limited.

However, for the purpose of improving productivity and reducing cost in the foregoing manufacture of the single crystal 108 based on the CZ method, the increase in the growth rate of the single crystal 108 is one main method, and accordingly various improvements have hitherto been made in order to achieve the increase in the growth rate of the single crystal 108.

It has been known that the growth rate of the single crystal 108 is determined by heat balance of the single crystal 108 during growth and can be increased by efficiently removing the heat emitted from a surface of the single crystal. In the case, an enhancement of a cooling effect on the single crystal 108 enables the single crystal to be further efficiently manufactured. Furthermore, it has been known that crystal quality is varied depending on a cooling speed of the single crystal 108. For example, Grown-in defects formed in the silicon single crystal during the growth of the single crystal can be controlled by a ratio of the pulling rate (the growth rate) of the single crystal to a temperature gradient in the crystal, and a defect-free single crystal (a single crystal of N-region) can be grown by controlling this (See Japanese Unexamined Patent publication (Kokai) No. H11-157996). Thus, the enhancement of the cooling effect on a single crystal during growth is important for manufacturing the defect-free single crystal and for improving productivity by increasing the growth rate of the single crystal.

As a method for enhancing the cooling effect, there is proposed a structure that comprises a gas flow-guide cylinder 103 for flow-guiding an inert gas and a heat-insulating ring 104 for intercepting direct heat radiation from the heater and the raw material melt to the gas flow-guide cylinder 103 (See Japanese Unexamined Patent publication (Kokai) No. S64-65086). In this method, a heat-insulating effect by the heat-insulating ring and the cooling effect of the inert gas on the single crystal can be expected.

Moreover, there is disclosed a single-crystal manufacturing apparatus provided with a large heat-insulating means around a single crystal to improve the heat-insulating effect (See Japanese Patent No. 3634867).

There is also disclosed a gas flow-guide cylinder that allows observing a shape of the single crystal during growth by providing the gas flow-guide cylinder with a quartz window plate, in addition to the above-described effect of the gas flow-guide cylinder (See Japanese Unexamined Patent publication (Kokai) No. H3-97688). However, the purpose of the quartz window plate is to observe the crystal or optical measurement for controlling a diameter thereof, and it is not involved in the viewpoint concerning the cooling effect.

DISCLOSURE OF INVENTION

However, in the above-described single-crystal manufacturing apparatus having the gas flow-guide cylinder 103 and the heat-insulating ring 104, it cannot be said that its cooling capacity is high, considering the radiant heat from the single crystal is absorbed into a cooling chamber.

In the above-described single-crystal manufacturing apparatus provided with the large heat-insulating means, although radiation from the heater and the melt can be effectively intercepted by providing with the large heat-insulating means in the close vicinity of the crystal, radiation from the single crystal is thereby also intercepted, and resulting in decreasing a cooling efficiency on the crystal. In the above-described single-crystal manufacturing apparatus in which the gas flow-guide cylinder is provided with the window plate made of quartz, although the heat-insulating effect by a graphite cylinder and the cooling effect by the inert gas can be expected, the cooling efficiency thereof is insufficient.

The present invention was accomplished in view of the above-explained problems, and its object is to provide a single-crystal manufacturing apparatus that can suppress intercepting the heat radiation from the single crystal and that can improve the cooling effect on the single crystal. In addition, an another object is to provide a single-crystal manufacturing method that can manufacture a single crystal of N-region with improving the growth rate thereof by using the single-crystal manufacturing apparatus and that can improve productivity.

To achieve these objects, the present invention provides a single-crystal manufacturing apparatus based on the Czochralski method comprising at least: a main chamber configured to accommodate a crucible for containing a raw material melt and a heater for heating the raw material melt; a pulling chamber continuously provided above the main chamber, the pulling chamber into which a grown single crystal is pulled and accommodated; a gas inlet provided in the pulling chamber; a gas flow-guide cylinder downwardly extending from a ceiling of the main chamber, the gas flow-guide cylinder being made of graphite; and a heat-insulating ring upwardly extending from a lower end portion of the gas flow-guide cylinder with a diameter of the heat-insulating ring increased so as to surround an outside of the gas flow-guide cylinder, wherein at least one window is provided in a region between 50 and 200 mm from a lower end of the gas flow-guide cylinder, and an opening area of the window accounts for 50% or more of a surface area of the region between 50 and 200 mm from the lower end of the gas flow-guide cylinder.

In this manner, when at least one window is provided in a region between 50 and 200 mm from a lower end of the gas flow-guide cylinder, and an opening area of the window accounts for 50% or more of a surface area of the region between 50 and 200 mm from the lower end of the gas flow-guide cylinder, the single-crystal manufacturing apparatus can efficiently radiate the heat of the single crystal from the window provided in the gas flow-guide cylinder without insulating it halfway, while intercepting direct heat radiation from the heater and the melt to the gas flow-guide cylinder and the single crystal with the heat-insulating ring, and the cooling effect can be thereby improved. Moreover, the improvement of the cooling effect enables an increase in the growth rate of the single crystal, and the productivity can be consequently improved.

In this case, the window of the gas flow-guide cylinder can be closed with a window plate made of quartz.

In this manner, when the window of the gas flow-guide cylinder is closed with the window plate made of quartz, the heat radiated from the single crystal can be transmitted from the window plate made of quartz, while a flow-guiding effect on the inert gas by the gas flow-guide cylinder is prevented from decreasing, the cooling effect on the single crystal can be further improved.

In this case, a distance between the lower end of the gas flow-guide cylinder and a surface of the melt is preferably 10 to 100 mm.

In this manner, when the distance between the lower end of the gas flow-guide cylinder and the surface of the melt is 10 mm or more, a vibration of the melt surface and blowing of the melt, which are due to a flowing speed of the inert gas to be flow-guided being too high, can be prevented from occurring, and when it is 100 mm or less, the cooling effect on the single crystal can be surely improved.

Furthermore, the present invention provides a single-crystal manufacturing method wherein a silicon single crystal of N-region is manufactured by using the single-crystal manufacturing apparatus according to the present invention.

In this manner, when the silicon single crystal of N-region is manufactured by using the single-crystal manufacturing apparatus according to the present invention, the cooling effect on the single crystal during pulling can be enhanced, that is, a temperature gradient in the crystal can be made larger, and the silicon single crystal of N-region can be therefore manufactured at a higher growth rate. The productivity can be consequently improved.

The single-crystal manufacturing apparatus according to the present invention is configured that at least one window is provided in a region between 50 and 200 mm from a lower end of the gas flow-guide cylinder, and an opening area of the window accounts for 50% or more of a surface area of the region between 50 and 200 mm from the lower end of the gas flow-guide cylinder, and manufactures the single crystal. The single-crystal manufacturing apparatus can therefore radiate the heat of the single crystal from the window provided in the gas flow-guide cylinder, while intercepting direct heat radiation from the heater and the melt to the gas flow-guide cylinder with the heat-insulating ring, and the cooling effect can be thereby improved. Moreover, the improvement of the cooling effect enables the increase in the growth rate of the single crystal, and the productivity can be consequently improved.

BEST MODE FOR CARRYING OUT THE INVENTION

Hereinafter, an embodiment of the present invention will be explained, but the present invention is not restricted thereto.

Conventionally, it has been known that the growth rate of the single crystal is determined by heat balance of the single crystal during the growth and can be increased by efficiently removing the heat emitted from a surface of the single crystal. In the case, an enhancement of a cooling effect on the single crystal enables the single crystal to be further efficiently manufactured.

Furthermore, Grown-in defects formed in a silicon single crystal during the growth of the single crystal can be controlled by a ratio of the pulling rate (the growth rate) of the single crystal to a temperature gradient in the crystal, and a defect-free single crystal can be grown by controlling this.

Thus, the enhancement of the cooling effect on the single crystal during the growth is an important subject for manufacturing the defect-free single crystal and for increasing the growth rate of the single crystal to improve productivity.

In the subject as above, the present inventors accordingly focused attention on the fact that conventionally a measure of insulating heat radiated from the heater and the melt to the single crystal halfway is mainly taken and that the radiation of heat from the single crystal has not been considered well, and repeatedly keenly conducted studies. As a result, the present inventors conceived that efficiently radiating the heat from the single crystal enables further improving the cooling effect and that the heat from the single crystal can be efficiently radiated by providing with a larger window than ever before at a part of the gas flow-guide cylinder. The present inventors also investigated the best mode for carrying out these, and thereby bringing the present invention to completion.

Figure 1:
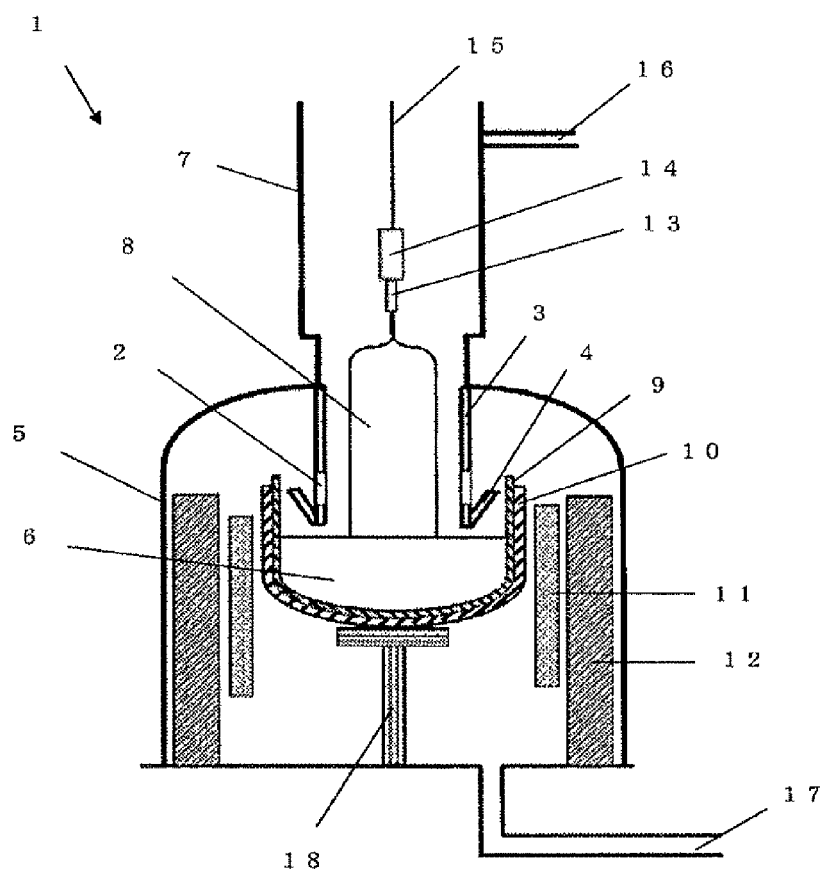
FIG. 1 is a schematic view showing an example of the single-crystal manufacturing apparatus according to the present invention.

FIG. 1 is a sectional view showing an example of the single-crystal manufacturing apparatus according to the present invention.

In the single-crystal manufacturing apparatus 1, as shown in FIG. 1, the crucibles 9 and 10 for containing the raw material melt 6, the heater 11 for heating and melting a raw material and the like are accommodated in the main chamber 5. A pulling mechanism (not shown) for pulling a grown single crystal 8 is provided at an upper portion of the pulling chamber 7 continuously provided above the main chamber 5.

A pulling wire 15 is reeled out from the pulling mechanism installed at the upper portion of the pulling chamber 7, and a seed holder 14 for attaching a seed crystal 13 is connected at the end of the pulling wire. The single crystal 8 is formed below the seed crystal 13 by dipping the seed crystal 13 attached at the end of the seed holder 14 in the raw material melt 6 and by winding up the pulling wire 15 with the pulling mechanism.

It is to be noted that the foregoing crucibles 9 and 10 are composed of an inside quartz crucible 9 for directly containing the raw material melt 6 and an outside graphite crucible 10 for supporting the quartz crucible 9. The crucibles 9 and 10 are supported with a crucible rotating shaft 18 that can be rotated and moved upwardly and downwardly by a rotation drive mechanism (not shown) installed at the lower portion of the single-crystal manufacturing apparatus 1. The crucibles 9 and 10 are moved upwardly for a distance corresponding to an amount of decrease in the melt according to the pulling of the single crystal 8 with being rotated in the opposite direction to rotation of the crystal so that the melt surface is maintained at a constant height in order to prevent changes in a crystal diameter and crystal quality that may be caused by a change in the melt surface in the single-crystal manufacturing apparatus 1.

The heater 11 is arranged so as to surround the crucibles 9 and 10. A heat-insulating member 12 for preventing the main chamber 5 from being directly exposed to the heat from the heater 11 is provided outside the heater 11 so as to surround a perimeter of the heater.

A cylindrical gas flow-guide cylinder 3 is provided so as to surround the single crystal 8 to be grown.

Here, graphite is used for the gas flow-guide cylinder 3, and the radiant heat from the heater and the melt to the single crystal 8 can be insulated.

For the purpose of discharging oxide generated inside a furnace to the outside of the furnace, an inert gas, such as an argon gas, is introduced from the gas inlet 16 provided at an upper portion of the pulling chamber 7 and passes inside the gas flow-guide cylinder 3. Thereafter, it is flow-guided so as to flow near the single crystal 8 during pulling, passes the surface of the raw material melt 6, passes above an upper end edge of the crucibles 9 and 10, and discharged from a gas outlet 17. This enables cooling the single crystal 8 during pulling by the gas and also preventing oxide deposition on the inside of the gas flow-guide cylinder 3, the upper end edge of the crucibles 9 and 10, and the like.

The heat-insulating ring 4 upwardly extending from the lower end portion of the gas flow-guide cylinder 3 with a diameter of the heat-insulating ring increased so as to surround the outside of the gas flow-guide cylinder 3 is provided. With the heat-insulating ring 4, the heat from the heater 11 and the raw material melt 6 can be insulated, and the gas flow-guide cylinder 3 and the single crystal 8 are prevented from being directly exposed to the heat.

It is to be noted that the main chamber 5 and the pulling chamber 7 are formed out of metal that is excellent in heat resistance and heat conductivity such as stainless steel, and cooled with water through a cooling pipe (not shown).

Figure 2:
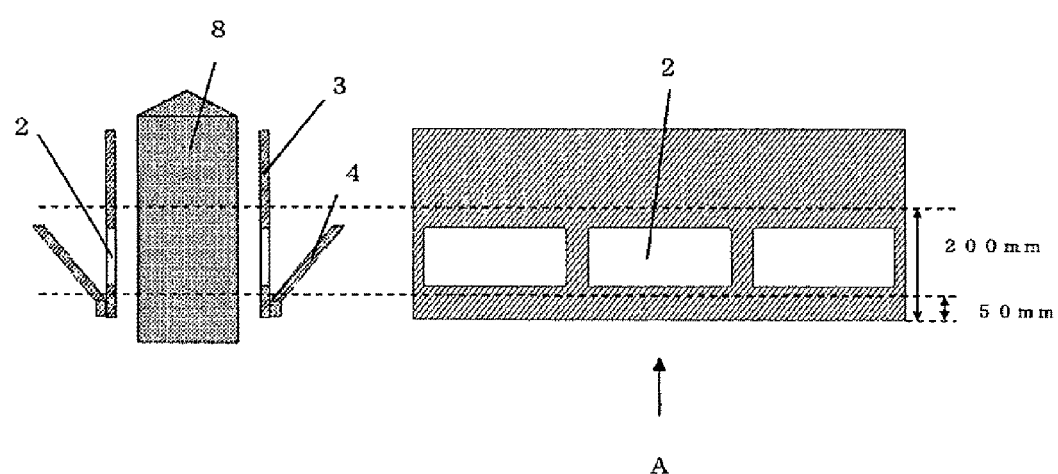
FIG. 2 is an explanatory view showing a condition where the gas flow-guide cylinder of the single-crystal manufacturing apparatus according to the present invention is provided with the windows.

Moreover, as shown in FIG. 1 and FIG. 2, at least one window 2 is provided in a region between 50 and 200 mm in height from the lower end of the gas flow-guide cylinder 3. The opening area of the window 2 accounts for 50% or more of the surface area of the region between 50 and 200 mm in height from the lower end of the gas flow-guide cylinder 3.

Here, "A" shown in FIG. 2 is a view of illustrating an outer circumferential surface of the gas flow-guide cylinder 3 on a plane. As shown in A, the gas flow-guide cylinder 3 in FIG. 2 shows an example in which three windows 2 are provided. The sum of the opening areas of the three windows 2 accounts for 50% or more of the surface area of the region between 50 and 200 mm in height from the lower end of the gas flow-guide cylinder 3.

As described above, when the gas flow-guide cylinder 3 is provided with the window 2, the heat from the single crystal 8 can be radiated without being insulated halfway. This radiated heat is absorbed and cooled by the main chamber. In this case, a heat-radiating effect becomes larger at a high temperature region in a lower portion of the single crystal 8, and the effect becomes more remarkable particularly in a region between the lower end of the gas flow-guide cylinder 3 and 200 mm from the lower end. However, a lower end portion of the heat-insulating ring 4 is provided in a region between the lower end of the gas flow-guide cylinder 3 and 50 mm (exclusive) from the lower end, and in order to secure strength required for supporting the heat-insulating ring 4, the window 2 is not accordingly provided in this region.

In addition, since there is the heat-insulating ring 4 at close range outside the region between the lower end of the gas flow-guide cylinder 3 and 50 mm (exclusive) from the lower end, a heat-radiating effect by providing the window in this region is hardly expected.

When the opening area of the window 2 accounts for 50% or more of the surface area of the region between 50 and 200 mm from the lower end of the gas flow-guide cylinder 3, the cooling effect can be surely improved.

It has been generally known that manufacture of a defect-free crystal including N-region needs to control in such a manner that V/G becomes constant, where a manufacture rate of the crystal is V [mm/min] and a temperature gradient in a solid-liquid interface is G [° C./mm].

The single-crystal manufacturing apparatus according to the present invention can improve the cooling effect on the single crystal as mentioned above, and can thereby make the temperature gradient in a solid-liquid interface larger. The single crystal 8 can be accordingly manufactured at a higher growth rate, and the productivity can be consequently improved.

Figure 3:
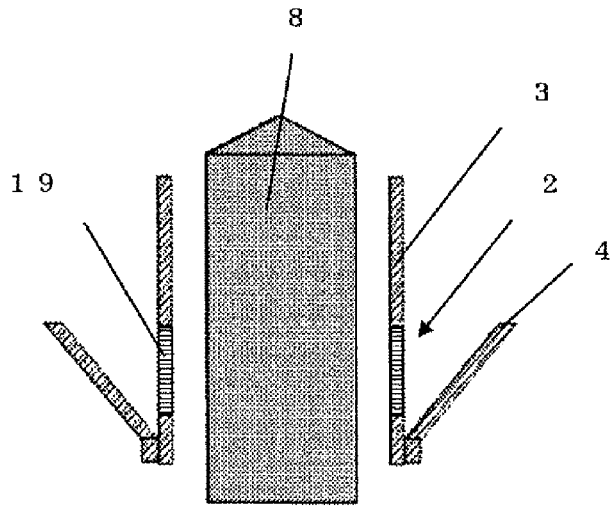
FIG. 3 is an explanatory view showing a condition where the window plate made of quartz is provided in the window of the gas flow-guide cylinder of the single-crystal manufacturing apparatus according to the present invention.

In this case, as shown in FIG. 3, the window 2 of the gas flow-guide cylinder 3 can be closed with a window plate 19 made of quartz.

As described above, when the window 2 of the gas flow-guide cylinder 3 is closed with the window plate 19 made of quartz, the heat radiated from the single crystal 8 can be transmitted from the window plate 19 made of quartz, while a flow-guiding effect on the inert gas by the gas flow-guide cylinder 3 is prevented from decreasing due to the window 2, and the cooling effect can be further improved.

Here, a material that has heat resistance and transmits infrared rays can be used as a material of the window plate 19 of the gas flow-guide cylinder 3, in addition to quartz.

In this case, the distance between the lower end of the gas flow-guide cylinder 3 and the surface of the melt 6 is preferably 10 to 100 mm.

As described above, when the distance between the lower end of the gas flow-guide cylinder 3 and the surface of the melt 6 is 10 mm or more, a vibration of the melt surface and blowing of the melt, which are due to a flowing speed of the inert gas to be flow-guided being too high, can be prevented from occurring, and when it is 100 mm or less, the cooling effect can be surely improved.

Here, the distance between the lower end of the gas flow-guide cylinder 3 and the surface of the melt 6 is preferably adjusted to an appropriate distance within the range of 10 to 100 mm according to specifications of the furnace or aimed quality of the single crystal 8 to be manufactured.

Next, the single-crystal manufacturing method for manufacturing a silicon single crystal of N-region by using the single-crystal manufacturing apparatus according to the present invention will be explained.

First, a polycrystalline silicon raw material with high purity is heated to a temperature of a melting point (approximately 1420° C.) or more in the crucible 9 and 10 and melted to be the melt 6. Then, an end of the seed crystal 13 is brought into contact with or dipped into the melt surface at almost center part thereof by reeling out the wire 15.

In this case, in order to eliminate dislocations generated when the seed crystal 13 is brought into contact with the raw material melt 6, the crystal is once made thin to a diameter of approximately 3 to 5 mm in an early stage of the growth, and the diameter is increased up to a desired diameter after the dislocations are eliminated so as to grow the single crystal 8 having aimed quality. Alternatively, without performing the necking as described above, the single crystal 8 can be grown by using the dislocation-free seeding method in which the seed crystal 13 having a pointed tip is used, the seed crystal 13 is gently brought into contact with the raw material melt 6 to dip the seed crystal up to a predetermined diameter, and thereafter the seed crystal is pulled.

Thereafter, while the crucible rotating shaft 18 is rotated in an appropriate direction, the wire 15 is wound up with being rotated to pull the seed crystal 13, and thereby growth of the single crystal 8 is started.

During the pulling, the single crystal 8 of N-region is grown with appropriately controlling a V/G value.

As described above, when the silicon single crystal of N-region is manufactured by using the single-crystal manufacturing apparatus according to the present invention, the cooling effect on the single crystal during pulling can be enhanced, that is, a temperature gradient in a solid-liquid interface can be made larger, and the silicon single crystal of N-region can be therefore manufactured at a higher growth rate. The productivity can be consequently improved.

As explained above, the single-crystal manufacturing apparatus according to the present invention is configured that at least one window is provided in a region between 50 and 200 mm from a lower end of the gas flow-guide cylinder, and an opening area of the window accounts for 50% or more of a surface area of the region between 50 and 200 mm from the lower end of the gas flow-guide cylinder, and manufactures the single crystal. The single-crystal manufacturing apparatus can therefore radiate the heat of the single crystal from the window provided in the gas flow-guide cylinder, while intercepting direct heat radiation from the heater and the melt to the gas flow-guide cylinder with the heat-insulating ring, and the cooling effect can be thereby improved. Moreover, the improvement of the cooling effect enables an increase in the growth rate of the single crystal, and the productivity can be consequently improved.

Hereinafter, the present invention will be explained in more detail based on Examples and Comparative Example, but the present invention is not restricted thereto.

Example 1

The single-crystal manufacturing apparatus according to the present invention as shown in FIG. 1 was used to manufacture a N-region silicon single crystal having a diameter of 200 mm. The heat-removal amount at the upper portion of the main chamber and the manufacture time were evaluated.

The crucible having a diameter of 650 mm was used. Three windows as shown in FIG. 2 was provided in the region between 50 and 200 mm from the lower end of the gas flow-guide cylinder. A ratio of the opening area thereof to the surface area of the region between 50 and 200 mm was 72%. The distance between the lower end of the gas flow-guide cylinder and the surface of the melt was 50 mm.

First, a polycrystalline silicon raw material with high purity having a weight of 180 kg was charged into the crucible and was heated to a temperature of a melting point (approximately 1420° C.) or more to be the melt. The single crystal was grown with controlling the V/G value during pulling so as to be a single crystal of N-region.

Figure 4:
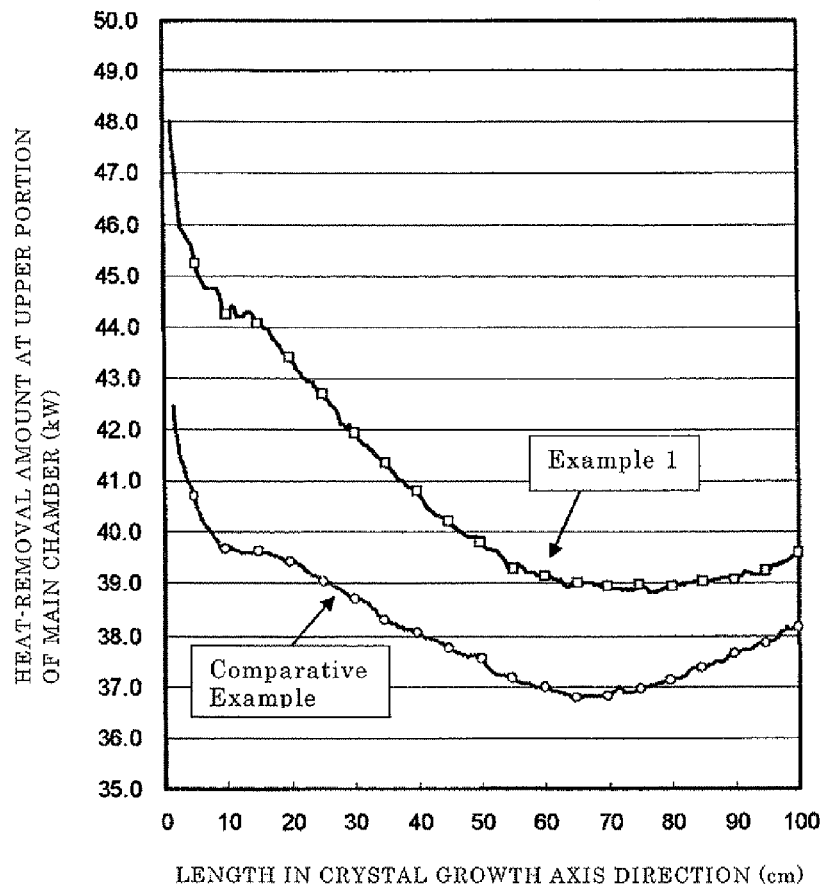
FIG. 4 is a graph showing changes in a heat-removal amount at an upper portion of the main chamber during the single crystal growth in Example 1 and Comparative Example.

FIG. 4 shows a change in the heat-removal amount at the upper portion of the main chamber during the single crystal growth in this case.

As shown in FIG. 4, it was revealed that the heat-removal amount was larger than the result of the later-described Comparative Example and that the cooling effect was thus improved.

The improvement of the cooling effect brought about the increase in the growth rate, and the manufacture time was able to be improved by 16% as compared with the result of Comparative Example.

It was thus confirmed that the single-crystal manufacturing apparatus according to the present invention can improve the cooling effect during single crystal growth and that can improve the productivity by increasing the growth rate of the single crystal.

Moreover, this single-crystal manufacturing apparatus was used to manufacture a silicon single crystal having a diameter of 200 mm. During the pulling, the growth rate was gradually decreased. Defect distribution of the obtained single crystal was evaluated.

Figure 5:
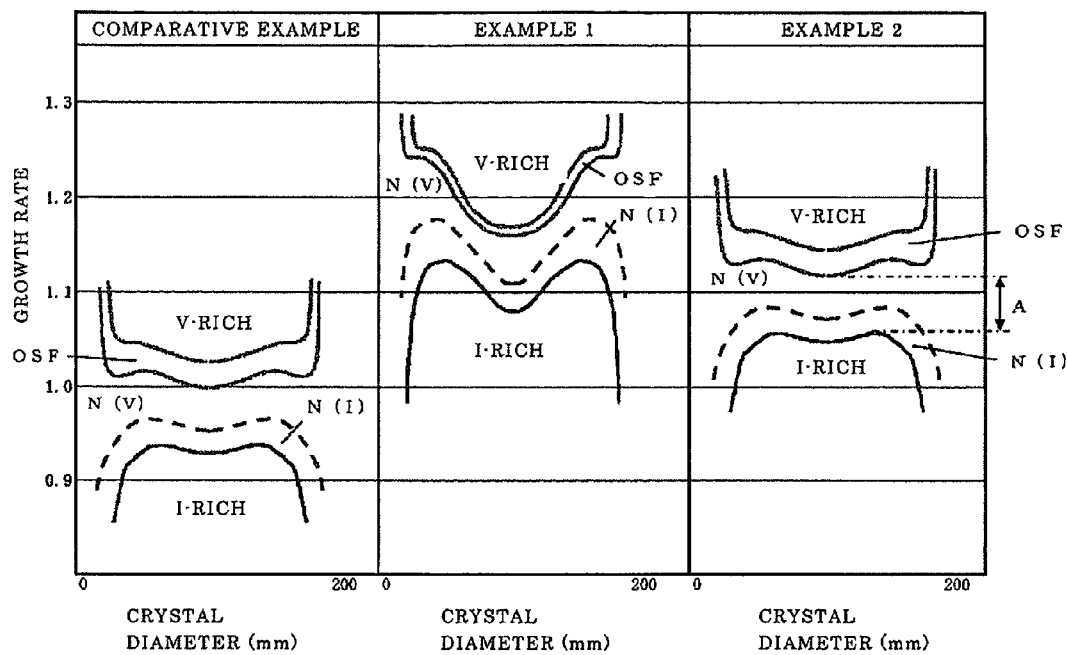
FIG. 5 is a view showing the results of the growth rate and crystal defect distribution in Examples and Comparative Example.

The result is shown in FIG. 5. A vertical axis of FIG. 5 shows a relative rate when a growth rate at which OSF disappeared in the later-described Comparative Example was 1.0. As confirmed by FIG. 5, the growth rate of a region of generating each defect was higher than that of the later-described Comparative Example.

Example 2

With the same single-crystal manufacturing apparatus as Example 1 except that the distance between the lower end of the gas flow-guide cylinder and the surface of the melt was 58 mm, the growth rate was gradually decreased during the pulling as with Example 1, and defect distribution of the obtained single crystal was evaluated.

The result is shown in FIG. 5. As shown in FIG. 5, it was revealed that although the growth rate was somewhat lower than Example 1, the growth rate at which N-region can obtain was higher than that of the later-described Comparative Example. For example, with regard to N-region right below an OSF region at the vicinity of a center axis of the crystal, the growth rate of Example 2 was improved by 12% as compared with that of Comparative Example.

In comparison with the result of Example 1, it was revealed that with regard to a range of the growth rate at which all parts in a crystal diameter can become N-region (a range of A in the figure), Example 2 had a wider range. In comparison with Comparative Example, it was revealed that Example 2 has the almost same shape distribution except for the difference of the growth rate.

It was thus confirmed that the defect distribution depending on the growth rate can be improved by adjusting the distance between the lower end of the gas flow-guide cylinder and the surface of the melt. It was also confirmed that the growth rate can be improved without deterioration of the defect distribution in comparison with the case of using a conventional single-crystal manufacturing apparatus.

Comparative Example

Figure 6:
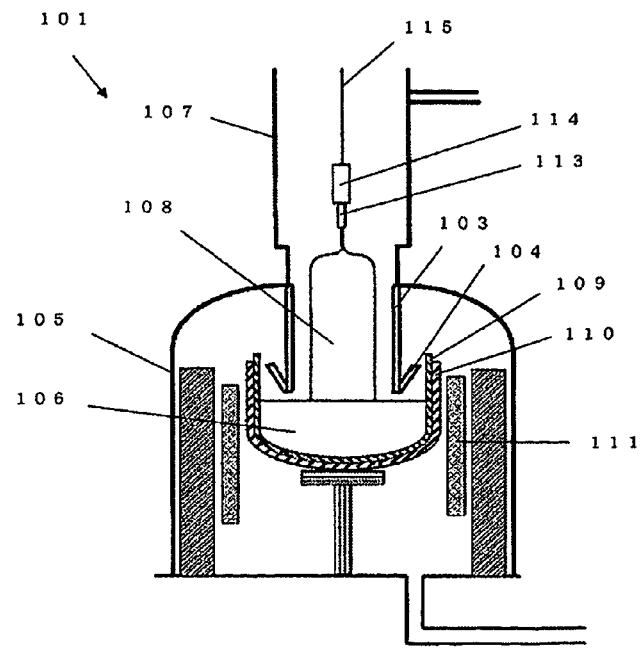
FIG. 6 is a schematic view showing an example of a conventional single-crystal manufacturing apparatus.

A silicon single crystal of N-region was manufactured in the same conditions as Example 1 except for using a conventional single-crystal manufacturing apparatus as shown in FIG. 6, and the same evaluation was carried out as with Example 1.

FIG. 4 shows the result of the heat-removal amount at the upper portion of the main chamber in this case.

As shown in FIG. 4, it was revealed that the heat-removal amount was smaller than the result of Example 1.

Moreover, this conventional single-crystal manufacturing apparatus was used to manufacture a silicon single crystal having a diameter of 200 mm. During the pulling, the growth rate was gradually decreased. Defect distribution of the obtained single crystal was evaluated.

The result is shown in FIG. 5. As confirmed by FIG. 5, the growth rate at which N-region can obtain was lower than that of Examples.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A single-crystal manufacturing apparatus based on the Czochralski method comprising at least: a main chamber configured to accommodate a crucible for containing a raw material melt and a heater for heating the raw material melt; a pulling chamber continuously provided above the main chamber, wherein the pulling chamber is configured to pull and accommodate a grown single crystal; a gas inlet provided in the pulling chamber; a gas flow-guide cylinder downwardly extending from a ceiling of the main chamber, the gas flow-guide cylinder being made of graphite with the entire gas flow-guide cylinder being configured to guide gas flow to the grown single crystal; and a heat-insulating ring upwardly extending from a lower end portion of the gas flow-guide cylinder with a diameter of the heat-insulating ring increased so as to surround an outside of the gas flow-guide cylinder, wherein at least one window is provided in a region between 50 and 200 mm from a lower end of the gas flow-guide cylinder, and an opening area of the window accounts for 50% or more of a surface area of the region between 50 and 200 mm from the lower end of the gas flow-guide cylinder, and the window of the gas flow-guide cylinder is closed with a window plate made of quartz.

2. The single-crystal manufacturing apparatus according to claim 1, wherein a distance between the lower end of the gas flow-guide cylinder and a surface of the melt is 10 to 100 mm.

* * * * *